(12) United States Patent
Gao et al.

(10) Patent No.: US 11,122,631 B2
(45) Date of Patent: Sep. 14, 2021

(54) LINK RECOVERY IN WIRELESS COMMUNICATIONS

(71) Applicant: ZTE Corporation, Guangdong (CN)

(72) Inventors: Bo Gao, Guangdong (CN); Yijian Chen, Guangdong (CN); Shujuan Zhang, Guangdong (CN); Zhaohua Lu, Guangdong (CN)

(73) Assignee: ZTE Corporation, Guangdong (CN)

( * ) Notice: Subject to any disclaimer, the term of this patent is extended or adjusted under 35 U.S.C. 154(b) by 0 days.

(21) Appl. No.: 17/247,374

(22) Filed: Dec. 9, 2020

(65) Prior Publication Data

US 2021/0105834 A1 Apr. 8, 2021

Related U.S. Application Data

(63) Continuation of application No. PCT/CN2018/099223, filed on Aug. 7, 2018.

(51) Int. Cl.
*H04W 4/00* (2018.01)
*H04W 74/08* (2009.01)
*H03M 13/15* (2006.01)
*H04W 72/04* (2009.01)
*H04L 5/00* (2006.01)

(52) U.S. Cl.
CPC ....... *H04W 74/0833* (2013.01); *H03M 13/15* (2013.01); *H04L 5/0048* (2013.01); *H04W 72/042* (2013.01)

(58) Field of Classification Search
CPC .......... H04W 74/0833; H04W 72/042; H04W 52/00; H03M 13/15; H04L 5/0048
See application file for complete search history.

(56) References Cited

U.S. PATENT DOCUMENTS

| | | | | |
|---|---|---|---|---|
| 2016/0353440 | A1* | 12/2016 | Lee | H04W 72/0453 |
| 2019/0230730 | A1* | 7/2019 | Wang | H04W 76/19 |
| 2019/0320469 | A1* | 10/2019 | Huang | H04L 5/0053 |
| 2020/0374917 | A1* | 11/2020 | Takeda | H04W 72/04 |

FOREIGN PATENT DOCUMENTS

| | | |
|---|---|---|
| CN | 108023630 A | 5/2018 |
| CN | 108093481 A | 5/2018 |

(Continued)

OTHER PUBLICATIONS

R2-1800560 (Sharp, Vancouver, Canada, Jan. 22-26, 2018, "remaining issues on beam failure recovery") (Year: 2018).*

(Continued)

*Primary Examiner* — Maharishi V Khirodhar
(74) *Attorney, Agent, or Firm* — Perkins Coie LLP

(57) ABSTRACT

A wireless communication method includes transmitting, by a first communication node, a first type of random access preamble, monitoring, by the first communication node, a link recovery confirmation information, performing, by the first communication node, after meeting a first type of condition, and the first type of condition includes detecting the link recovery confirmation information, an operation including performing a transmission on an outbound channel to a second communication node using a spatial filter determined by the first type of random access preamble.

18 Claims, 11 Drawing Sheets

(56) References Cited

FOREIGN PATENT DOCUMENTS

CN        108111286 A     6/2018
CN        108112074 A     6/2018

OTHER PUBLICATIONS

International Search Report and Written Opinion, PCT/CN2018/099223, dated Apr. 16, 2019, 9 pages.
Catt, "Beam Failure Recovery" 3GPP TSG-RAN WG2#101 R2-1802151, Athens, Greece, Feb. 26-Mar. 2, 2018, 5 pages.
Partial Search Report for EP Appl. No. 18929673.4, dated Jun. 29, 2021, 16 pages.
Huawei et al.: "Summary of remaining issues on beam failure recovery", 3GGP Draft; R1-1800101, 3RD Generation Partnership Project (3GPP), Mobile Competence Centre, 16 pages, Jan. 22-26, 2018, 9 pages.
Mediatek Inc: "Remaining Issues on Beam Management", 3GPP; R1-1906788, 3rd Generation Partnership-Project (3GPP), May 21-25, 2018, 7 pages.

* cited by examiner

LINK RECOVERY IN WIRELESS COMMUNICATIONS

CROSS REFERENCE TO RELATED APPLICATIONS

This patent document is a continuation of and claims benefit of priority to International Patent Application No. PCT/CN2018/099223, filed on Aug. 7, 2018. The entire content of the before-mentioned patent application is incorporated by reference as part of the disclosure of this application.

TECHNICAL FIELD

This patent document relates to the field of communications, and in particular, to configuration and transmission of data, control and reference signals.

BACKGROUND

Efforts are currently underway to define next generation wireless communication networks that provide greater deployment flexibility, support for a multitude of devices and services and different technologies for efficient bandwidth utilization. For better bandwidth utilizations, techniques such as the use of multiple antennas and spatial selectivity for transmission and/or reception are also being used.

SUMMARY

Techniques are disclosed for efficient link recovery for a channel from a user device to a network node. In one advantageous aspect, a base station can effectively receive the uplink channel, thereby ensuring the effectiveness of the entire link recovery process and significantly improving the system's flexibility.

In one example aspect, a method for wireless communication is disclosed. The method includes transmitting, by a first communication node, a first type of random access preamble, monitoring, by the first communication node, a link recovery confirmation information, performing, by the first communication node, after meeting a first type of condition, and the first type of condition includes detecting the link recovery confirmation information, an operation including performing a transmission on an outbound channel to a second communication node using a spatial filter determined by the first type of random access preamble.

In another example aspect, a method of wireless communication is disclosed. The method includes transmitting, by a first communication node, a first type of random access preamble, monitoring, by the first communication node, a link recovery confirmation information, performing, by the first communication node, after meeting a first type of condition, and the first type of condition includes detecting the link recovery confirmation information, an operation including: performing a transmission on an outbound channel to a second communication node, using a spatial filter determined by a second type of signal that is transmitted on the outbound channel.

In yet another aspect, another method of wireless communication is disclosed. The method includes transmitting a first type of random access preamble by a first communication node, monitoring a link recovery confirmation information, by the first communication node; performing, by the first communication node, after meeting a first type of condition, and the first type of condition includes detecting the link recovery confirmation information, an operation including performing a transmission on an outbound channel to a second communication node, and configuration information for the transmission on the outbound channel is unprovided.

In yet another example aspect, another method of wireless communication is disclosed. The method includes receiving an indication that a terminal is attempting link recovery, and transmitting, in response, to the indication, a link recovery confirmation information message to the terminal for facilitating the link recovery.

In yet another example aspect, a wireless communication apparatus is disclosed. The apparatus includes a processor that is configured to implement the above-described methods.

In yet another example aspect, a computer-program storage medium is disclosed. The computer-program storage medium includes code stored thereon. The code, when executed by a processor, causes the processor to implement a described method.

These, and other, aspects are described in the present document.

BRIEF DESCRIPTION OF THE DRAWING

The drawings are intended to provide a further understanding of the present document, and are intended to be a part of the present document. In the drawing.

DETAILED DESCRIPTION

Figure 1:
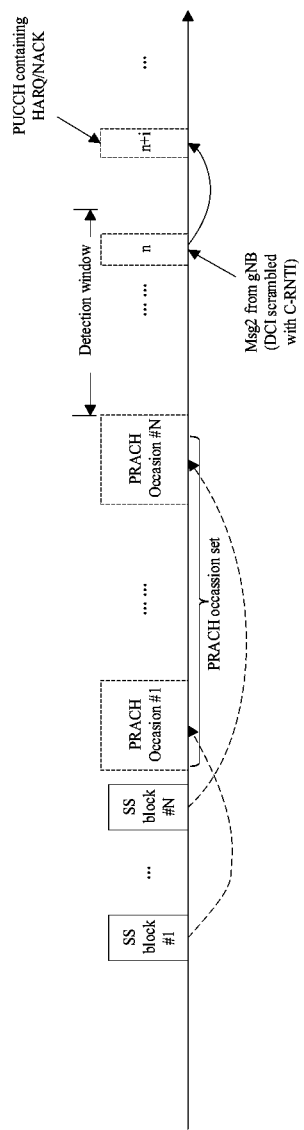
FIG. 1 is a schematic diagram of an example of a link recovery process according to the present document.

To provide additional spectrum that can be used to meet the growing demand for wireless data communication, the ultra-wide bandwidth high frequency band (e.g., millimeter wave communication) is emerging as a direction for the development of mobile communication in the future, attracting the attention of academic and industrial circles around the world. In particular, the advantages of millimeter waves have become more and more attractive when the increasingly congested spectrum resources and physical networks are heavily accessed. In many standards organizations, such as IEEE and 3GPP, corresponding standardization work has begun. For example, in the 3GPP standard group, high-frequency communication is an important feature of 5G New Radio Access Technology (New RAT) with its significant advantages of large bandwidth.

For a network node such as a base station, there may be multiple antenna panels, and each antenna panel may generate multiple beams. For the UE side, there is a similar situation may occur. It is therefore beneficial to provide a mixed analog and digital domain multiple beam scheme using which reference signal, data channel and control channel are transmitted or received.

In the existing 5G communication standard, when the received channel quality of the physical downlink control channel (PDCCH) is lower than the threshold and one reference signal with channel quality that is greater than or equal to one threshold is found, the UE may actively initiate a link recovery procedure to indicate the reference signal by sending the physical random access channel (PRACH) resource associated with the reference signal. However, since the UE is still in the RRC CONNECT mode, the spatial relation configured by the uplink control channel, (e.g., the uplink beam information), is still valid, but in fact, the physical uplink control channel (PUCCH) using the beam indicated by the spatial relation may not be received by the base station, and the problem of link recovery can still occur.

The techniques described in the present document can be used to solve the above described problem, and others. While various embodiment examples are described with reference to 5G technologies, these techniques can also be implemented in other wireless systems. Furthermore, the terms uplink and downlink channels are used for ease of understanding in the 5G framework. However, in general, from a user device's perspective, the uplink channel may simply refer to a "from channel" over which the user device transmits signals and the downlink channel may simply refer to a "to channel" over which the user device (sometimes called a UE or a terminal) receives signals.

Some disclosed embodiments determine the spatial relation or the beam information of the PUCCH and other uplink channels according to the UE-side link-recovery PRACH, and determines the uplink power control parameters and processes of the PUCCH and other uplink channels, ensuring that, after the link recovery process is started, the base station can effectively receive the uplink channel, thereby ensuring the effectiveness of the entire link recovery process and significantly improving the system's lubricity.

Beam recovery, also known as link recovery, is a process for resolving a sudden degradation in a link. Beam recovery includes both contention-free beam recovery and contention-based beam recovery. In particular, some details are as below.

A contention-free link recovery procedure: a fast UE activated reporting process is initiated by the physical layer, in which the UE first detects the original PDCCH link quality (also referred to as q_0). Below the first type of threshold, and a link that is higher than the second type of threshold (called q_new) is found from the pre-configured potential beam/link set (also referred to as q_1), and the UE side actively reports through the PRACH. After receiving the PRACH, the base station acknowledges the UE's link recovery request by transmitting the C-RNTI (cell radio network temporary identifier) scrambled DCI (downlink control indicator) on the link recovery dedicated search space or the control resource set (CORESET).

Contention-based link recovery procedure: Similar to the contention-free link recovery procedure, the link recovery request is sent through the PRACH, but the PRACH resource is not a UE-specific resource, that is, the base station cannot confirm specific identify of the UE after receiving the PRACH resource. Identity information. Therefore, after receiving the PRACH, the base station sends an RA-RNTI scrambled DCI to confirm the receipt of the PRACH information, and then in the Msg3, the UE reports its own C-RNTI information, thereby notifying the base station its own identity information. Thereafter, the PDCCH and the PDSCH can be transmitted through the normal transmission mode in the RRC CONNECT mode.

The beam may be considered to be a resource (e.g., a spatial filter at the transmitting end, a spatial filter at the receiving end, a precoding at the transmitting end, a precoding at the receiving end, an antenna port, an antenna weight vector, an antenna weight matrix, etc.), and the beam index may be replaced with resource index (e.g., reference signal resource index). The beam may also be an associated a transmission (transmit/receive) mode; the transmission mode may include space division multiplexing, frequency domain/time domain diversity, or another transmission technique. A spatial filter may provide spatial selectivity of transmission.

The reference signal includes an uplink reference signal and a downlink reference signal. The uplink reference signal may be the sounding reference signal (SRS). The uplink reference signal may be the phase tracking reference signal (PT-RS). The uplink reference signal may be the demodulation reference signal (DMRS).

In some embodiments, the downlink reference signal may be the channel state information reference signal (CSI-RS). In some embodiments, the downlink reference signal may be the PT-RS. In some embodiments, the downlink reference signal may be the Synchronization signal block (SSB). In some embodiments, the downlink reference signal may be the Synchronization signal/physical broadcast channel (SS/PBCH). In some embodiments, the downlink reference signal may be the DMRS.

In some embodiments, one PUSCH transmission, which is scheduled by one random access response (RAR) uplink grant or DCI format 0_0 or 0_1 used for the link recovery confirmation information, from the UE is also called as Msg3 PUSCH.

FIG. 1 is a schematic diagram of a link recovery process. FIG. 1 describes a link-recovery procedure based on contention-free mode. Through the pre-configuration of the base station, the new candidate link set q_1 has a clear relationship with the PRACH resource. After the link associated with q_0 fails and the q_new selected from q_1 is equal to or greater than the threshold of the second type, the UE sends the random access preamble associated with the q_new to the gNB. Under the corresponding detection window, the UE attempts to receive the acknowledgment information from the gNB, that is, the C-RNTI scrambled DCI format is detected on the link recovery dedicated search space of the control resource set (CORESET). If the DCI or one DCI after the DCI triggers a PDSCH transmission, the PUCCH carries HARQ/ACK information indicating whether the PDSCH is successfully demodulated.

Until the TCI state of the PDCCH is reconfigured or reactivated, both the PDSCH and the PDCCH obey the downlink reference channel indicated by q_new as a spatial parameter.

Figure 2:
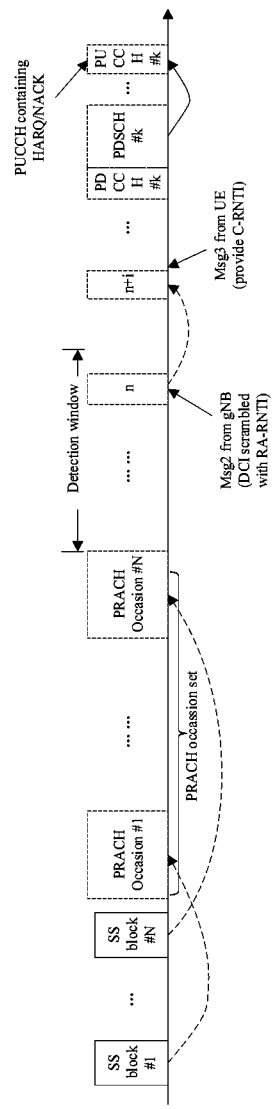
FIG. 2 is a schematic diagram of another exemplary process of link recovery according to the present document.

FIG. 2 is another schematic flowchart of link recovery according to the present document, and describes a contention-based link recovery procedure. Through the pre-configuration of the base station, each beam of the new candidate beam set q_1 has a clear relationship with each PRACH resource. When the beam associated with q_0 fails and a new beam q_new equal to or greater than the second type threshold is found, the UE sends the q_new associated with PRACH information is given to gNB. Under the corresponding detection window, the UE attempts to receive Msg2 from the gNB, that is, one DCI signaling scrambled by the RA-RNTI, assuming that it occurs at time n. At time n+i, the UE feeds back the Msg3 to the base station, where the Msg3 carries the C-RNTI information or the link recovery indication information, which is used to indicate that the current procedure is the link recovery procedure from the UE with the C-RNTI.

Until the TCI state of the PDCCH is reconfigured or reactivated, both the PDSCH and the PDCCH will obey the downlink reference channel indicated by q_new as a spatial parameter.

If the DCI format 1_0/1_1 triggers the PDSCH transmission, the PUCCH sends the HARQ/NACK information for carrying the PDSCH association.

In addition, DCI format 0_0/0_1 can trigger the transmission of PUSCH.

EXAMPLE EMBODIMENTS

A method for transmitting a reference signal is applied to a first communication node, and the method includes:

When the first type of condition is met, the first communication node determines, according to at least one of the following, a transmission mode of the uplink channel:
1 The uplink channel uses the same spatial filter as the first type of PRACH;
2 determine a spatial relation or a spatial filter of the uplink channel according to the first type of PRACH;
3 Ignore or release the configuration information of the spatial relation of the uplink channel; or
4 The configuration information of the spatial relation of the uplink channel is default or not configured or not provided, or the configuration information of the uplink channel dedicated to the first communication node is default or not configured or not provided.

The uplink channel is sent to the second communication node.

Further, the first type of condition includes at least one of the following:
1 The first communication node sends a PRACH;
2 Detection of the first type of RNTI scrambled DCI in the configured window and the configured search space;
3 Receiving link recovery confirmation information or link recovery confirmation information from the second communication node;

The uplink channel is a PUCCH or a PUSCH.

Further, the first type of RNTI is at least one of the following: C-RNTI, TC-RNTI, and RA-RNTI.

Further, a spatial relation or a spatial filter of the reference signal is determined according to the PRACH.
where the spatial relation or spatial filter of the uplink channel or the reference signal is determined according to the first type of PRACH, indicating at least one of the following:
Updating spatial relation information of the uplink channel to be associated with the index information of the PRACH;
The spatial filter of the uplink channel or reference signal is the same as the spatial filter used or associated with the PRACH;
The spatial filter of the uplink channel or reference signal is similar to the spatial filter used or associated with the PRACH;

Further, the PRACH is used for link recovery.

Alternatively, the configured window is used for link recovery,

Alternatively, the configured search space is used for link recovery or beam recovery, or the configured search space of the associated control channel resource set is used for link recovery or beam recovery.

Further, the cell of the PRACH is a primary cell, or the carrier of the PRACH is a primary carrier, or the PRACH belongs to an MCG.

Further, the cell of the uplink channel is a primary cell, or the carrier of the uplink channel is a primary carrier, or the uplink channel is associated with an MCG.

The PUCCH resource may be a dedicated PUCCH resource, where the dedicated PUCCH resource takes effect only after the first type of condition is met. Further, the PUCCH resource is used only in the link recovery process.

Alternatively, the PUCCH is a default PUCCH resource when the UE has not receive a dedicated UE-specific PUCCH configuration, or a default PUCCH resource is configured for a default PUCCH; or the PUCCH is a common PUCCH resource.

Further, the common PUCCH resource is indicated by a common PUCCH resource field in SIB 1.

Alternatively, the PUCCH resource is also a PUCCH resource configured by the current UE, but the spatial relation information thereof is reconfigured, or the spatial filter associated with the PRACH is used by default.

When considering the secondary cell or the other cell group, the UE may also want to perform link recovery, but the PRACH resource of the primary cell is used for the occurrence, or the feedback is performed by using the MAC-CE signaling. In some cases, the primary cell beam does not have a problem, and consequently link recovery only for the secondary cell may be performed. The only uplink channel of the secondary cell may have to be updated, or the first communication node considers that the previous configured spatial relation information for the secondary cell is released.

Further, the first type of condition further includes at least one of the following:
(1) The carrier of the PRACH is the same as the carrier that has the link recovery condition, or the carrier index of the PRACH is the same as the carrier group where the link recovery condition occurs;
(2) The cell of the PRACH is the same as the cell in which the link recovery condition occurs, or the cell index of the PRACH is the same as the cell group in which the link recovery condition occurs;

Further: the outbound or uplink channel has the following features:
(1) The carrier of the PRACH is the same as the carrier of the uplink channel, or the carrier index of the PRACH is the same as the carrier group of the uplink channel;
(2) The cell of the PRACH is the same as the cell of the uplink channel, or the carrier index of the PRACH is the same as the cell group of the uplink channel;
(3) The outbound or uplink channel is located in the cell or carrier that meets the link recovery condition.

The link recovery process is only a temporary process for solving the problem of link failure. Therefore, it is useful to design one end time or condition of the link recovery process, which is referred to as the first type of event. When the process ends, the uplink and downlink transmissions are performed according to the configuration information in the normal RRC CONNECT state.

Further, until the first type of event occurs, the first communication node determines the transmission mode of the uplink channel according to at least one of the following: #1 the uplink channel uses the same spatial filter as the first type of PRACH; #2 determines according to the first type of PRACH spatial relation of the uplink channel; #3 ignoring or releasing the configuration information of the spatial relation of the uplink channel; #4 the configuration information of the spatial relation of the uplink channel is default or not configured or not provided. In various embodiments, the configuration information of the channel is either default or unconfigured or unprovided.

One example of the first type of event is when TCI status is reconfigured or reactivated. Another example of the first type event is the spatial relation associated with the uplink channel is reconfigured or reactivated.

Further example includes, when the uplink channel is a PUCCH, the uplink channel in which the spatial relation associated with the uplink channel is reconfigured or reactivated is also a PUCCH.

Further example includes, when the uplink channel is a PUSCH, the spatial channel associated with the uplink channel is reconfigured or reactivated, and the uplink channel may be a PUCCH, or the spatial relation associated with the uplink channel is the spatial relation of the SRS used for codebook or non-codebook transmission mode of the PUSCH.

Figure 3:
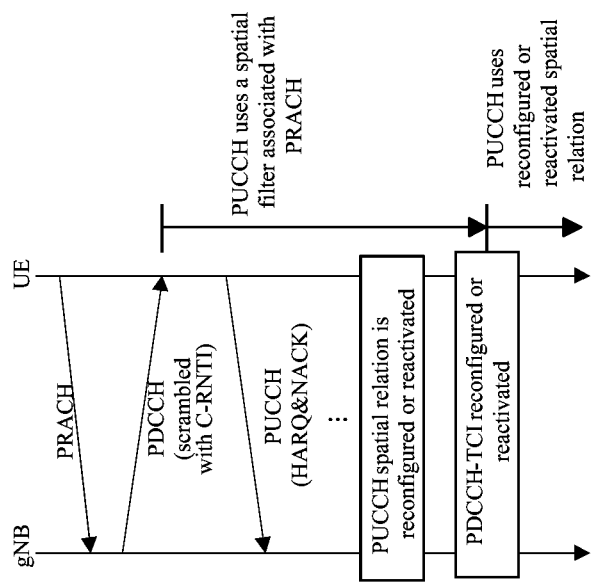
FIG. 3 is an embodiment of determining a physical uplink control channel (PUCCH) spatial relation according to the present document.

FIG. 3 is an embodiment of determining a PUCCH spatial relation according to the present document. After the UE sends the PRACH triggered link recovery request and receives the C-RNTI scrambled PDCCH, the UE considers that the link recovery request is acknowledged. The first communication node, (e.g., the UE) assumes that the PUCCH resource the same spatial filter as the PRACH, and the spatial relation information previously configured or activated for the PUCCH resource will be ignored or released. However, the assumed end time is the time when the TCI of the PDCCH is reconfigured or reactivated, after which the PUCCH will use the spatial relation information that have been reconfigured or reactivated. Therefore, the spatial information of the PUCCH also is updated by the corresponding RRC or MAC-CE signaling before the TCI of the PDCCH is reconfigured or reactivated. Accordingly, the process depicted in FIG. 3 includes the UE determining that a condition has occurred and based on the determining, performing a transmission of the PUCCH by using the beam of the PRACH until a time that the UE determines that an event (e.g., PDCCH TCI is reconfigured or reactivated) has occurred.

Figure 4:
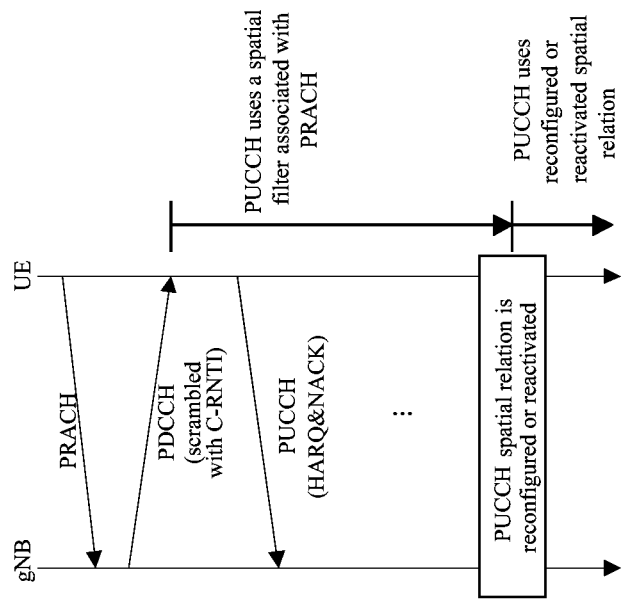
FIG. 4 is another embodiment of determining a PUCCH spatial relation according to the present document.

FIG. 4 is another embodiment of determining a PUCCH spatial relation according to the present document. After the UE sends the PRACH triggered link recovery request and receives the C-RNTI scrambled PDCCH, the UE considers that the link recovery request is acknowledged. The first communication node, (e.g., the UE), assumes that the PUCCH resource will use the same spatial filter as the PRACH, and the spatial relation information previously configured or activated for the PUCCH resource will be ignored or released. However, the assumed end time is that the spatial relation of the PUCCH is reconfigured or reactivated, after which the PUCCH will use the reconfigured or reactivated spatial relation information.

Figure 5:
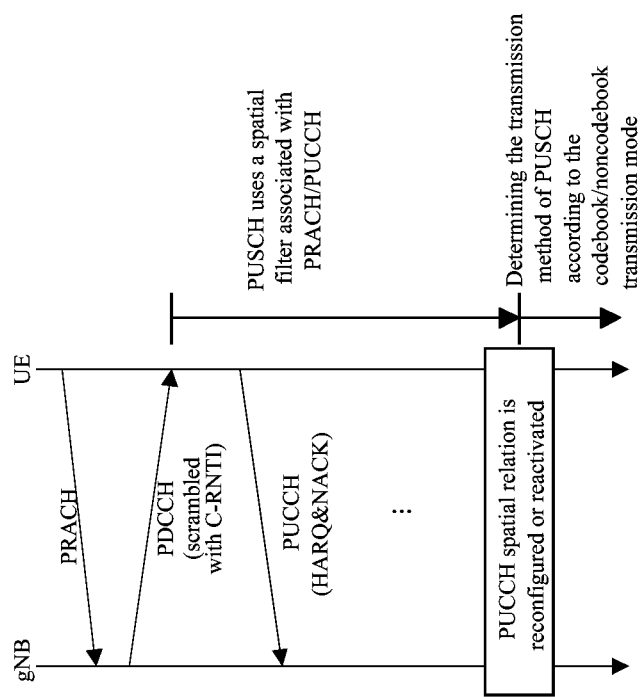
FIG. 5 is an embodiment of determining a physical uplink shared channel (PUSCH) transmission mode according to the present document.

FIG. 5 is an embodiment of determining a PUSCH transmission mode according to the present document. After the UE sends the PRACH triggered link recovery request and receives the C-RNTI scrambled PDCCH, the UE considers that the link recovery request is acknowledged. The first communication node will assume that the PUSCH uses the same spatial filter as the PRACH or PUCCH until the spatial relation of the PUCCH is reconfigured or reactivated. When the spatial relation of the PUCCH is reactivated or reconfigured, the PUSCH will determine its transmission mode according to the PUSCH transmission configuration of the codebook or non-codebook option.

Because the uplink beam (e.g., the uplink spatial relation or the uplink spatial filter) changes, the power control parameters of the uplink channel also may be adjusted accordingly to ensure uplink parameters and avoid interference.

Further, the power control parameter of the uplink channel may be performed by at least one of the following:
1 The path loss reference RS set configuration of the uplink channel is regarded as default, or is not configured, or is released by default;
2 The configuration of the PUCCH target power set is regarded as default, or is not configured, or is released by default;
3 The configuration of the target power of the PUSCH and the set of the weight coefficient alpha are regarded as default, or are not configured, or are released by default;

Further, the reference signal of the path loss estimation associated with the uplink channel may be at least one of the following:
1 The downlink reference signal associated with the PRACH;
2 The upper layer provides the downlink reference signal associated with the index q_new;
3 The result of the channel measurement metric of the reference signal is greater than the first type threshold;
4 The path loss of the uplink channel refers to the downlink reference signal indicated by the specific index in the RS set;

The channel measurement metric includes at least one of the following: BLER, RSRP, RSRQ, CQI, channel capacity, signal-to-noise ratio, and signal-to-noise ratio.

Further, the target power associated with the uplink channel is at least one of the following:
1 one target power with a specific index in the target power set;
2 one preamble received target power, or one preamble received target power plus the value indicated by transmission power command (TPC) in the DCI;
3 The target power associated with the uplink channel is not configured, or the default value;
where the target power is UE-specific target power.
where the default value is 0.

Further, the closed loop power control of the uplink channel is:
1 has a specific index; or
2 is a pump-up value associated with the random access preamble, or a pump-up value associated with the random access preamble plus the value indicated by transmission power command (TPC) in the downlink control information; or
3 is reset.

Further, the specific index is at least one of the following: the index is 0, the lowest index, and the highest index.

Further, in addition to the spatial relation information, the dedicated parameters associated with the first communication node are assumed to be default or unprovided, where the dedicated parameter includes at least one of the following: a downlink reference signal, and an uplink reference signal, PUCCH, PUSCH, power control parameters.

Further, the periodic or semi-persistent uplink reference signal or the uplink channel is not transmitted by the first communication node, or the first communication node does not receive a periodic or semi-continuous downlink reference signal or a downlink channel.

In some embodiments, the reference signal may be SRS for codebook, or SRS for non-codebook. In some embodiments, the reference signal may be CSI-RS for non-codebook.

Figure 6:
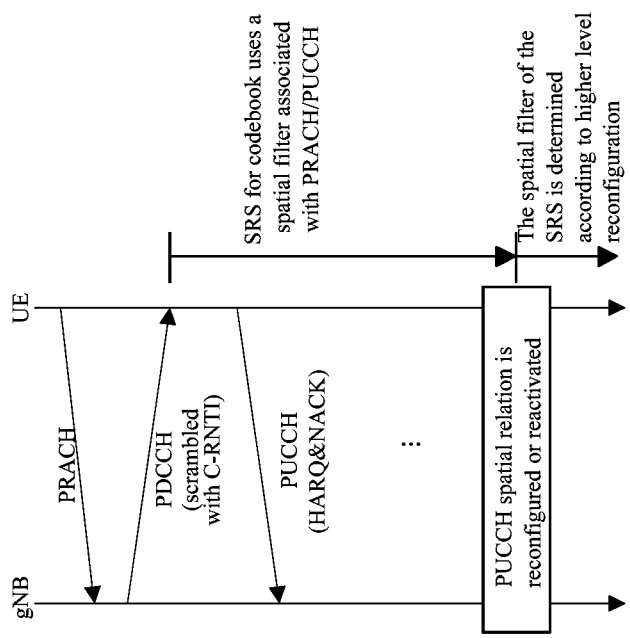
FIG. 6 is a schematic diagram of uplink reference signal transmission according to the present document.

FIG. 6 is a schematic diagram of uplink reference signal transmission according to the present document. After the UE receives the acknowledgment information of the gNB link recovery, the SRS used for the codebook transmission will use the same spatial filter as the PRACH/PUCCH, which will facilitate the guarantee of the uplink transmission quality, taking into account the transmission chain corresponding to the original SRS. It is very likely that the road is no longer able to communicate effectively. When the spatial relation of the PUCCH is reconfigured or reactivated, the spatial filter of the SRS will be determined based on the spatial relation information of the upper layer.

Figure 7:
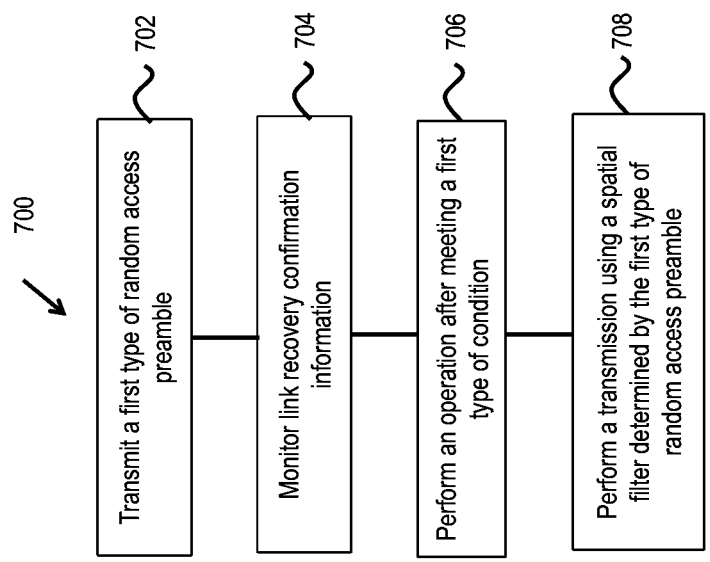
FIG. 7 is flowchart for an example method of wireless communication.

FIG. 7 is a flowchart for an example method 700 of wireless communication. The method 700 includes transmitting (702), by a first communication node, a first type of random access preamble, monitoring (704), by the first communication node, a link recovery confirmation information, performing (706), by the first communication node, after meeting a first type of condition, and the first type of condition includes detecting the link recovery confirmation information, an operation including: performing (708) a transmission on an outbound channel to a second communication node using a spatial filter determined by the first type of random access preamble.

Figure 8:
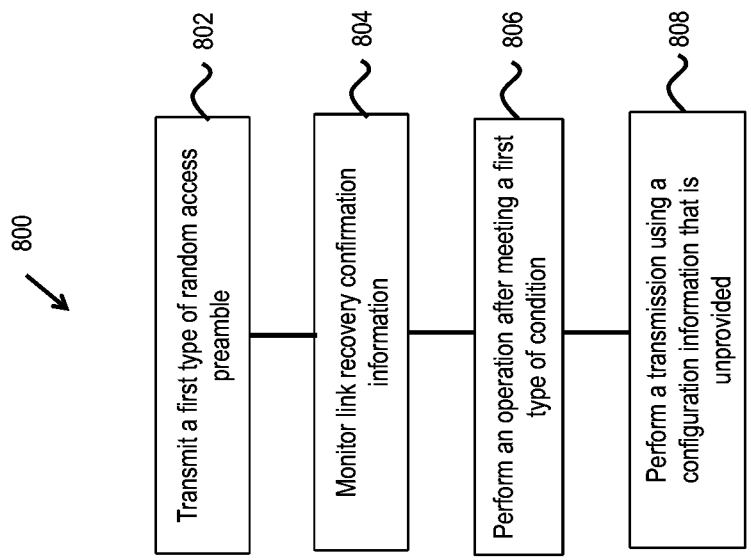
FIG. 8 is flowchart for an example method of wireless communication.

FIG. 8 is a flowchart for an example method 800 of wireless communication. The method 800 includes transmitting (802) a first type of random access preamble by a first communication node, monitoring (804) a link recovery confirmation information, performing (806), after meeting a first type of condition, and the first type of condition includes detecting the link recovery confirmation information, an operation including: performing (808) a transmission on an outbound channel to a second communication node, and configuration information for the transmission on the outbound channel is unprovided.

In some embodiments, a wireless communication method performed by a first communication node includes transmitting a first type of random access preamble, monitoring a link recovery confirmation information, performing after meeting a first type of condition, where the first type of condition includes detecting the link recovery confirmation information, an operation including performing a transmission on an outbound channel to a second communication node, using a spatial filter determined by a second type of signal that it transmitted from on the outbound channel.

Figure 9:
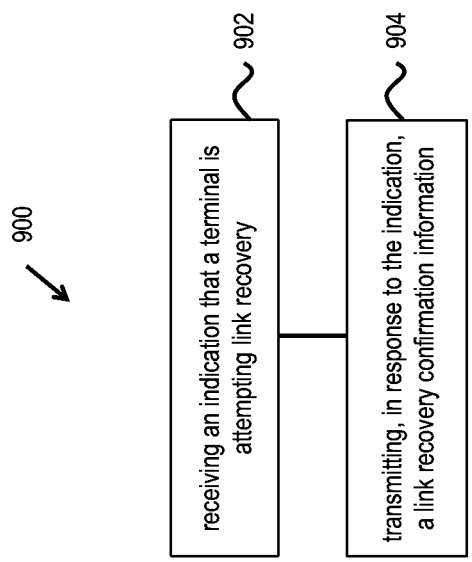
FIG. 9 is flowchart for an example method of wireless communication.

FIG. 9 is a flowchart of an example method 900 of wireless communication. The method 900 may be implemented by a network node such as a base station in a wireless network. The method 900 includes receiving an indication that a terminal is attempting link recovery, and transmitting, in response to the indication, a message to the terminal for facilitating the link recovery. As disclosed in the present document, the message may be in the form of an encrypted DCI and may be sent within a time window.

In some embodiments, the message that is transmitted may facilitate various aspects of link recovery that are described throughout the present patent document. These include, for example, providing cyclic redundancy check using a RNTI, a signal, providing within a configured window, etc. to acknowledge the terminal's attempt of link recover. Other examples include transmitting information in system information block. As further disclosed in the present document, the network node may be in a primary cell and receiving on a primary carrier. The terminal (e.g., a user device or the first communication node) may transmit on the random access channel to the network node.

With respect to the above-described methods, including 700, 800, and 900, the following features may be implemented in various embodiments.

In some embodiments, the configuration information of the spatial relation of the outbound channel is default or unprovided.

In some embodiments, the configuration information of the uplink channel is default or unprovided.

In some embodiments, the link recovery confirmation information includes a DCI with CRC scrambled by a first type of RNTI.

In some embodiments, the monitoring of link recovery information may be performed by monitoring an inbound transmission from the second communication device to the first communication device indicating that the second communication device has realized that a link recovery process is to begin. In some embodiments, the second type of signal may include Msg3 signal. In some embodiments, the second type of signal may be a PUSCH. In some embodiments, the second type of signal may be a PUSCH in response to the link recovery confirmation information. In some embodiments, the second type of signal may be a PUCCH in response to the link recovery confirmation information.

In some embodiments, the outbound channel includes a physical uplink control channel. In some embodiments, the outbound channel includes a physical uplink shared channel. In some embodiments, the transmission is performed on a physical random access channel of a primary cell. For example, the first communication node may be operating in a cellular network with a primary cell and a secondary cell. One example of such an arrangement is described in Release 15 of 3GPP.

In some embodiments, the transmission is performed on a physical random access channel corresponding to a primary carrier. In some embodiments, the transmission is performed on a physical random access channel corresponding to a master cell group.

In some embodiments, the outbound channel is in a primary cell, or a carrier of the outbound channel is a primary carrier, or the outbound channel is associated with a master cell group. In some embodiments, the outbound channel is a dedicated physical uplink control channel having dedicated transmissions resources upon meeting the first type of condition.

In some embodiments, the outbound channel is a default physical uplink control channel when the dedicated resources for physical uplink control channel are unconfigured or unprovided. In some embodiments, the outbound channel is a common physical uplink control channel resource.

In some embodiments, the common physical uplink control channel resource is provided by a common physical uplink control channel resource field in a system broadcast message.

In some embodiments, the first type of condition includes: a carrier of the transmission is same as a carrier where a link recovery condition is met, or a carrier of the transmission is in a carrier group where the link recovery condition is met.

In some embodiments, the first type of condition includes: a cell of the transmission is same as a cell in which a link recovery condition is met, or a cell of the transmission is in a cell group in which the link recovery condition is met.

In some embodiments, the first type of condition includes: a carrier of the transmission is same as a carrier of the outbound channel, or a carrier of the transmission is in a carrier group as the outbound channel.

In some embodiments, the link recovery condition may be that a number of beam failure instance indication is equal to or greater than a first threshold. In some embodiments, the link recovery condition may be that a channel quality of a second type of reference signals from a second pool is equal to or greater than a second threshold. In some embodiments, the link recovery condition may be that a channel quality of a third type of reference signals from a third pool is less than the second threshold. These various thresholds may be pre-defined for the operation of the wireless network in which the first and second communication nodes operate, or may be specified by the second communication node.

In some embodiments, the first type of condition includes: a cell of the transmission is same as a cell of the outbound channel, or a carrier of the transmission is in a cell group of the outbound channel.

In some embodiments, the method is further performed until occurrence of a first type of event.

In some embodiments, the first type of event is a reconfiguration or an activation of a transmission configuration indicator (TCI), or reconfiguration or activation of the spatial relation associated with the outbound channel.

In some embodiments, a path loss reference signal set configuration of the outbound channel is regarded as default, or is unprovided, or is released by default.

In some embodiments, a configuration of a target power set of the outbound channel is regarded as default, or is unprovided, or is released by default.

In some embodiments, a configuration of the target power of a shared control channel of the outbound channel and a set of weight coefficient alpha are regarded as default, or are unprovided, or are released by default.

In some embodiments, a reference signal of a path loss estimation associated with the outbound channel is a downlink reference signal associated with the first type of random access preamble.

In some embodiments, a reference signal of a path loss estimation associated with the outbound channel is provided by a higher layer message that includes information of a downlink reference signal index q_new;

In some embodiments, a reference signal of a path loss estimation associated with the outbound channel is a result of a channel measurement metric of the reference signal being greater than or equal to a first type threshold.

In some embodiments, a reference signal of a path loss estimation associated with the outbound channel refers to a downlink reference signal indicated by a specific index in a reference signal set.

In some embodiments, the channel measurement metric includes at least one of the following: BLER (block error ratio), RSRP (reference signal received power), RSRQ (reference signal received quality), CQI (channel quality indicator), channel capacity, signal-to-noise ratio at the receiving end, and signal-to-noise ratio.

In some embodiments, a target power associated with the outbound channel is a target power indicated by a specific index in a target power set. The target power set may be communicated to the first communication node from the network.

In some embodiments, a target power associated with the outbound channel is one preamble received target power, or one preamble received target power plus the value indicated by transmission power command (TPC) in the downlink control information.

In some embodiments, a target power associated with the outbound channel is unprovided, or has a default value. In some embodiments, a target power is dedicated to the first communication node. In some embodiments, the default value (of the target power) is zero.

In some embodiments, a closed loop power control of the outbound channel has a specific index. In some embodiments, a closed loop power control of the outbound channel is a pump-up value associated with the random access preamble, or a pump-up value associated with the random access preamble plus the value indicated by transmission power command (TPC) in the downlink control information. In some embodiments, a closed loop power control of the outbound channel is reset. In some embodiments, the specific index is zero or, a lowest index, or a highest index.

In some embodiments, a dedicated parameter associated with at least one of following signals is unprovided or is default: DL reference signal, UL reference signal, physical uplink control channel, physical uplink shared channel, or power control parameter.

In some embodiments, a periodic or semi-continuous outbound reference signal is untransmitted, or a periodic or semi-continuous inbound reference signal or an inbound channel are unmonitored or unreceived.

In some embodiments, the spatial relation of a reference signal is determined according to the random access preamble. In some embodiments, the reference signal is a sounding reference signal for a codebook, or a sounding reference signal for a non-codebook.

In some embodiments, a quasi-co location of a reference signal is determined according to one downlink reference signal associated with the random access preamble, where the reference signal is a channel state information reference signal for non-codebook.

In some embodiments, the first type of radio network temporary identifier (RNTI) is a C-RNTI, or a TC-RNTI, or a RA-RNTI.

In some embodiments described about "unprovided" or "unconfigured" may mean that the corresponding parameters have not been received from the network. Such parameters may be transmitted by a network node, such as a base station, in a broadcast message or a terminal-specific message to the first communication node.

Figure 10:
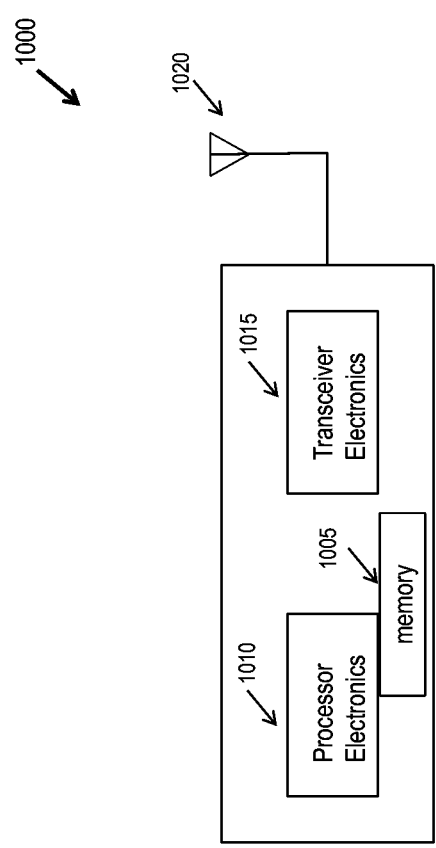
FIG. 10 is a block diagram of an example implementation of a wireless communication apparatus.

FIG. 10 is a block diagram of an example of a wireless communication apparatus 1000. The apparatus 1000 includes a processor 1010 that may be configured to implement one of the techniques described herein, transceiver electronics 1015 that is able to transmit signals or receive signals using the antenna(s) 1020, and one or more memories 1005 that may be used to store instructions executable by the processor 1010 and/or data storage. The apparatus 1000 may implement the various functionalities of a network node, or a communication device or a terminal, as described herein. For example, the apparatus may be embodied as a smartphone, a portable communication device, a computer, an internet of things (IoT) device or another wireless communication device. Alternatively, the apparatus may be embodied as a network node such as a base station providing wireless connectivity to multiple user devices.

Figure 11:
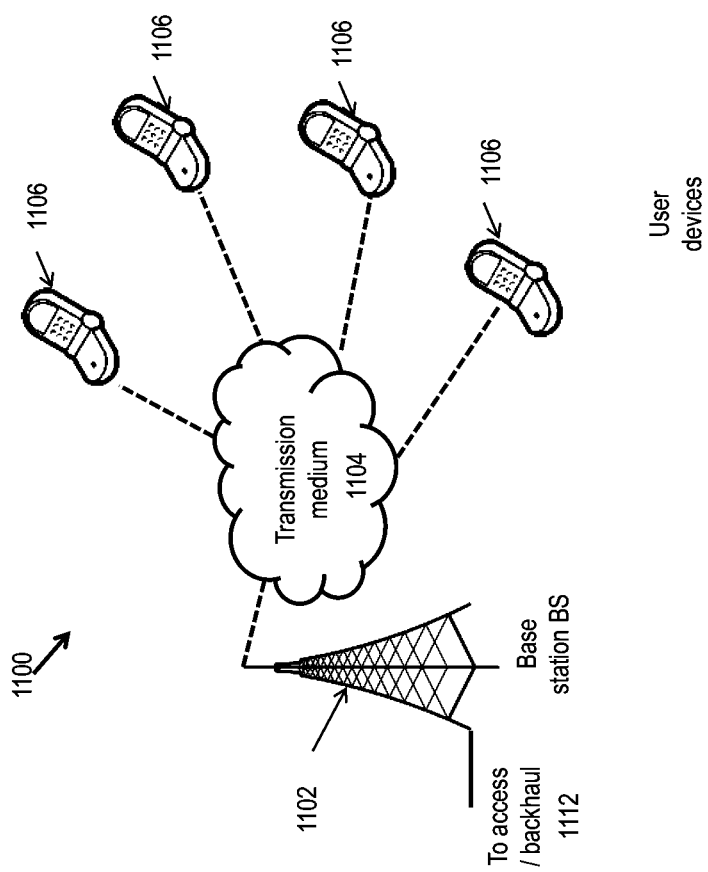
FIG. 11 is a block diagram of an example wireless communication network.

FIG. 11 shows an example wireless communications network 1100. The network 1100 includes a base station BS 1102 and multiple user devices 1106 being able to communicate with each other over a transmission medium 1104. The transmissions from the BS 1102 to the devices 1106 are generally called downlink or downstream transmissions. The transmissions from the devices 1106 to the BS 1102 are generally called uplink or upstream transmissions. The transmission medium 1104 typically is wireless (air) medium. The BS 1102 may also be communicatively coupled with other base stations or other equipment in the network via a backhaul or an access network connection 1112.

In summary, based on the technical solution provided by some of the disclosed embodiments, the spatial relation or beam information of the PUCCH and other uplink channels is determined according to the UE-side link recovery PRACH, and the uplink power control parameters of the PUCCH and other uplink channels are determined. The process ensures that the base station can effectively receive the uplink channel after the link recovery process is started, thereby ensuring the effectiveness of the entire link recovery process and significantly improving the system's lure.

One of ordinary skill in the art will appreciate that all or a portion of the above steps may be accomplished by a program that instructs the associated hardware, such as a read-only memory, a magnetic disk, or an optical disk. Optionally, all or part of the steps of the foregoing embodiments may also be implemented by using one or more integrated circuits. Accordingly, each module/unit in the foregoing embodiment may be implemented in the form of hardware, or may be implemented by using a software function module. Formal realization. The invention is not limited to any specific form of combination of hardware and software.

It is to be understood that the invention may be susceptible to various other modifications and changes in the embodiments of the present invention without departing from the spirit and scope of the invention. Corresponding changes and modifications are intended to be included within the scope of the appended claims.

What is claimed is:

1. A wireless communication method, comprising:
performing, by a user device, a random access preamble transmission to a network node;
monitoring, by the user device, a downlink control information with a cyclic redundancy check (CRC) scrambled by a first type of radio network temporary identifier; and
performing, by the user device after detecting the downlink control information with the CRC scrambled by the first type of radio network temporary identifier, a transmission on a channel using a same spatial filter as that for the random access preamble transmission, wherein a target power associated with the transmission on the channel is determined based on a specific index value indicating a target power in a target power set, and wherein a closed loop power control of the channel has the specific index value, the specific index value being equal to zero.

2. The method of claim 1, wherein a cell of the random access preamble transmission is same as a cell of the channel.

3. The method of claim 1, wherein the transmission on the channel is performed until a reconfiguration or activation of a spatial relation associated with the channel.

4. The method of claim 1, wherein a reference signal of a path loss estimation associated with the channel is based on a downlink reference signal with an index $q_{new}$ provided by higher layer.

5. The method of claim 1, wherein the closed loop power equals to a ramp-up value associated with the random access preamble transmission plus the value indicated by a transmission power command (TPC) in one downlink control information.

6. A wireless communication method, comprising:
receiving, by a network node, a random access preamble transmission from a user device;
transmitting a downlink control information with cyclic redundancy check (CRC) scrambled by a first type of radio network temporary identifier to the user device; and
receiving, by the network node in response to the downlink indictor with the CRC scrambled by the first type of radio network temporary identifier, a transmission on a channel using a same spatial filter as that for the random access preamble transmission, wherein a target power associated with the transmission on the channel is determined based on a specific index value indicating a target power in a target power set, and wherein a closed loop power control of the channel has the specific index value, the specific index value being equal to zero.

7. The method of claim 6, wherein a cell of the random access preamble transmission is same as a cell of the channel.

8. The method of claim 6, wherein a reference signal of a path loss estimation associated with the channel is based on a downlink reference signal with an index $q_{new}$ provided by higher layer.

9. The method of claim 6, wherein the closed loop power control of the channel equals to a ramp-up value associated with the random access preamble transmission plus the value indicated by a transmission power command (TPC) in one downlink control information.

10. An apparatus comprising:
a processor, wherein the processor is configured to:
perform a random access preamble transmission to a network node;
monitor a downlink control information with a cyclic redundancy check (CRC) scrambled by a first type of radio network temporary identifier; and
perform, after detecting the downlink control information with the cyclic redundancy check (CRC) scrambled by the first type of radio network temporary identifier, a transmission on a channel using a same spatial filter as that for the random access preamble transmission, wherein a target power associated with the transmission on the channel is determined based on a specific index value indicating a target power in a target power set, and wherein a closed loop power control of the channel has the specific index value, the specific index value being equal to zero.

11. The apparatus of claim 10, wherein a cell of the random access preamble transmission is same as a cell of the channel.

12. The apparatus of claim 10, wherein the processor is configured to perform the transmission on the channel until a reconfiguration or activation of a spatial relation associated with the channel.

13. The apparatus of claim 10, wherein a reference signal of a path loss estimation associated with the channel is based on a downlink reference signal with an index $q_{new}$ provided by higher layer.

14. The apparatus of claim 10, wherein the closed loop power control of the channel equals to a ramp-up value associated with the random access preamble transmission plus the value indicated by a transmission power command (TPC) in one downlink control information.

15. An apparatus comprising:
a processor, wherein the processor is configured to:
receive a random access preamble transmission from a user device;
transmit a downlink control information with cyclic redundancy check (CRC) scrambled by a first type of radio network temporary identifier to the user device; and
receive, in response the downlink control information with the CRC scrambled by the first type of radio network temporary identifier, a transmission on a channel using a same spatial filter as that for the random access preamble transmission, wherein a target power associated with the transmission on the channel is determined based on a specific index value indicating a target power in a target power set, and wherein a closed loop power control of the channel has the specific index value, the specific index value being equal to zero.

16. The apparatus of claim 15, wherein a cell of the random access preamble transmission is same as a cell of the channel.

17. The apparatus of claim 15, wherein a reference signal of a path loss estimation associated with the channel is based on a downlink reference signal with an index $q_{new}$ provided by higher layer.

18. The apparatus of claim 15, wherein the closed loop power control of the channel equals to a ramp-up value associated with the random access preamble transmission plus the value indicated by a transmission power command (TPC) in one downlink control information.

* * * * *

UNITED STATES PATENT AND TRADEMARK OFFICE
CERTIFICATE OF CORRECTION

PATENT NO. : 11,122,631 B2
APPLICATION NO. : 17/247374
DATED : September 14, 2021
INVENTOR(S) : Gao et al.

It is certified that error appears in the above-identified patent and that said Letters Patent is hereby corrected as shown below:

In the Claims

Column 13, Line 66, Claim 1, delete "the specific index value, the specific index value" and insert --another specific index, the another specific index--, therefor Column 14, Line 12, Claim 5, insert --equals-- before "to a ramp,", therefor Column 14, Line 13, Claim 5, delete "the" and insert --a--, therefor Column 14, Line 25, Claim 6, delete "indicator" and insert --control information--, therefor Column 14, Lines 32-33, Claim 6, delete "the specific index value, the specific index value" and insert --another specific index, the another specific index--, therefor Signed and Sealed this
Tenth Day of May, 2022

Katherine Kelly Vidal
*Director of the United States Patent and Trademark Office*